United States Patent
Mulatti et al.

[11] Patent Number: 6,153,914
[45] Date of Patent: *Nov. 28, 2000

[54] OUTPUT CIRCUIT FOR INTEGRATED CIRCUITS

[75] Inventors: Jacopo Mulatti, Latisana; Stefano Zanardi, Seriate; Carla Maria Golla, San Giovanni; Armando Conci, Milanino, all of Italy

[73] Assignee: STMicroelectronic S.r.l., Agrate Brianza, Italy

[*] Notice: This patent issued on a continued prosecution application filed under 37 CFR 1.53(d), and is subject to the twenty year patent term provisions of 35 U.S.C. 154(a)(2).

[21] Appl. No.: 09/170,788

[22] Filed: Oct. 13, 1998

[30] Foreign Application Priority Data

Oct. 24, 1997 [EP] European Pat. Off. ............... 97830542

[51] Int. Cl.⁷ .................................................. H01L 27/092
[52] U.S. Cl. .......................... 257/372; 257/371; 257/901; 326/34
[58] Field of Search ..................................... 257/371, 372, 257/373, 376, 203, 206, 207, 901; 326/33, 34; 327/537

[56] References Cited

U.S. PATENT DOCUMENTS

| 5,121,036 | 6/1992 | Fuji | 307/303 |
| 5,473,183 | 12/1995 | Yonemoto | 257/371 |
| 5,519,243 | 5/1996 | Kikuda et al. | 257/371 |
| 5,686,752 | 11/1997 | Ishimura et al. | 257/369 |
| 5,714,796 | 2/1998 | Chishiki | 257/544 |
| 5,838,047 | 11/1998 | Yamauchi et al. | 257/372 |
| 5,892,263 | 5/1999 | Tachiyama | 257/370 |

FOREIGN PATENT DOCUMENTS

| 0 614 222 A1 | 2/1994 | European Pat. Off. | 257/372 |
| 0 616 430 A2 | 2/1994 | European Pat. Off. | 257/372 |

OTHER PUBLICATIONS

Syuso Fujii, et al., "45–ns 16–Mbit DRAM with Triple–Well Structure, " IEEE Journal of Solid–State Circuits, vol. 24, No. 5, Oct. 1, 1989, pp. 1170–1175.

*Primary Examiner*—Donald L. Monin, Jr.
*Attorney, Agent, or Firm*—Theodore E. Galanthay; Allen, Dyer, Doppelt, Milbrath & Gilchrist, P.A.

[57] ABSTRACT

An output circuit for an integrated circuit, includes a first transistor and a second transistor connected in series between a first external voltage and a second external voltage external to the integrated circuit, respectively through first and second electrical connecting paths. The first transistor is for carrying an output line of the integrated circuit to the first external voltage, while the second transistor is for carrying the external line of the integrated circuit to the second external voltage. The second transistor is formed inside a first well of a first conductivity type contained inside a second well of a second conductivity type formed in a substrate of the first conductivity type. The second well of the second conductivity type is connected to the first external voltage through a third electrical connecting path distinct from the first electrical connecting path.

15 Claims, 3 Drawing Sheets

OUTPUT CIRCUIT FOR INTEGRATED CIRCUITS

FIELD OF THE INVENTION

The present invention relates to integrated circuits, and, more particularly, to an output buffer of the type normally employed in semiconductor integrated circuits for driving an output signal line.

BACKGROUND OF THE INVENTION

A semiconductor integrated circuit 100, shown in FIG. 1, normally includes an input stage 1 adapted for acquiring and regenerating external input signals 4. The integrated circuit 100 also includes generic internal circuitry 2 and an output stage 3 adapted to drive external signal lines 5 to which there is associated a load 6.

The output signal from such an output stage 3 is in general variable between different logic levels in relatively short times. For example, referring to FIG. 1, the output signal 5 switches between the reference voltage Gnd (0 V) and the supply voltage Vcc of the integrated circuit, typically equal to 5 V in the case of the CMOS logic family. The output stage 3 will therefore supply high currents in short times. Such currents can disturb the internal circuitry 2 and the input stage 1 of the integrated circuit. These disturbances could be interpreted, in the case of memory integrated circuits, as logic state transitions on the address signal bus 4, for the following reasons.

The terminals of the supply voltage, the reference voltage and the input/output signals provided on the semiconductor chip of the integrated circuit are respectively connected to a supply voltage line, a reference voltage line and input/output lines external to the chip by means of bonding wires. These bonding wires introduce parasitic inductances contributing to the creation of closed paths between the different stages, as shown in FIG. 2.

In this figure, Vcc and Gnd are the supply voltage line and the reference voltage line external to the integrated circuit chip. The stages 1 and 2 of FIG. 1 (of which only the former is shown in FIG. 2) are supplied by a first internal supply voltage Vcc1, connected to Vcc by means of a first metal wire L1 having a parasitic inductance L1. The reference voltage of these stages is GND1 that is connected to the external reference voltage Gnd by means of a second metal wire L3 having a parasitic inductance L3. The output stage 3 is supplied by a second internal supply voltage Vcc2 which is connected to the external supply voltage Vcc by means of a third metal wire L2 having a parasitic inductance L2, distinct from the first metal wire L1. The internal reference voltage Gnd2 for the output stage 3 is connected to the external reference voltage Gnd by means of a fourth metal wire L4 having a parasitic inductance L4, distinct from the second metal wire L3.

IN and OUT respectively are the terminals external to the integrated circuit for the connection of the input and output signals. These terminals are connected to the input stage 1 and to the output stage 3 through metal wires Lin and Lout having respective parasitic inductances Lin and Lout. Cload is a capacitive load. The input stage 1 generally comprises pull-up and pull-down transistors P1 and N1, while the output stage 3 comprises pull-up and pull-down transistors P2 and N2.

Referring to FIG. 3, the physical structure of the output stage 3 of FIG. 2 is shown. It can be noted that the P-channel pull-up transistor P2 is obtained by introducing into the P type substrate 7 donor atoms, so as to form an N type well 8. A subsequent introduction of acceptor atoms forms the drain and source regions 9, 10. The N type well 8 is biased at Vcc2. The drain and source regions 11, 12 of the pull-down N-channel transistor N2 are obtained by introducing donor atoms directly into the substrate 7 or, in the alternative case that transistor N2 is to have a particular threshold voltage, in a further P type well 13 formed in substrate 7 (twin-well process), with the substrate 7 being normally lightly doped.

C2 is the capacitance of the junction between the N type well 8 and the P type substrate 7, i.e. the capacitance between Vcc2 and Gnd1. C1 shown in FIG. 2 is the capacitance associated with the junction between the P type substrate 7 and one or more N type wells similar to the well 8 for the P-channel transistors of the input stages 1 and the circuitry 2, i.e. the capacitance coupling Vcc1 and Gnd1. Rsub is the resistance of the substrate 7.

If the potential of node Vcc2 fluctuates at low frequencies, the inductances of the metal wires are short circuits and the path γ formed by L1 and L2 is predominant. This is so since γ is the sole direct path between Vcc2 and Vcc1. At higher frequencies corresponding to the switching frequency of the output buffers, path β formed by capacitances C1 and C2 is predominant. In both cases, however, the disturbance on the input stage is limited.

If in contrast node Gnd2 fluctuates these fluctuations affect through the resistive path α, the input circuitry, due to the small equivalent resistance Rsub between Gnd2 and Gnd1. It is common practice to try to resolve this problem by introducing latches for the data and increasing the noise margin of the input buffers.

To eliminate the path α through the substrate resistance Rsub between Gnd2 and Gnd1, a known technique provides for using a so-called triple-well manufacturing process to form the output stage 3, as depicted in FIGS. 4 and 5. From FIG. 4 it is noted that in a triple-well structure the transistor N2 is formed inside a P type well 130, that in turn is formed inside an N type well 140 formed in the P type substrate 7.

Referring to FIG. 5, the use of the triple-well structure allows for eliminating, at least at low frequencies, the path α. In fact, connecting the P type well 130 to Gnd2 and the N type well 140 to Vcc2, the junctions of the P type well 130/N type well 140 and N type well 140/P type substrate 7 are reverse biased.

As however shown in FIG. 4, such junctions have associated therewith two further parasitic capacitances C21, between the N type well 140 and the P type substrate 7, and C22 between the P type well 130 and the N type well 140. These capacitances, even if they contribute to a better filtering of noise with respect to approaches not using the triple-well structure, still allow switching noise to be transferred to the input circuitry at high frequencies. This is more true the closer the cutoff frequency of the high-pass filter associated with C21 and C22 to the signal frequency, and thus the larger the capacitances C21 and C22.

SUMMARY OF THE INVENTION

Therefore, in view of the foregoing background, it is an object of the present invention to provide an improved output circuit suitable for further reducing noise problems.

According to the present invention, such an object is attained by an output circuit for an integrated circuit, comprising first transistor means and second transistor means connected in series between a first external voltage and a second external voltage external to the integrated circuit, respectively through first and second electrical connecting means. The first transistor means is for carrying an output line of the integrated circuit to the first external voltage. The second transistor means is for carrying the external line of the integrated circuit to the second external voltage. The second transistor means is formed inside a first well of a first conductivity type contained inside a second well of a second conductivity type formed in a substrate of the first conductivity type. The second well of the second conductivity type is connected to the first external voltage through third electrical connecting means distinct from the first electrical connecting means.

BRIEF DESCRIPTION OF THE DRAWINGS

The features and advantages of the present invention will be made apparent by the following detailed description of a practical embodiment thereof, illustrated by way of non-limiting example in the annexed drawings, wherein.

DETAILED DESCRIPTION OF THE PREFERRED EMBODIMENTS

Figure 6:
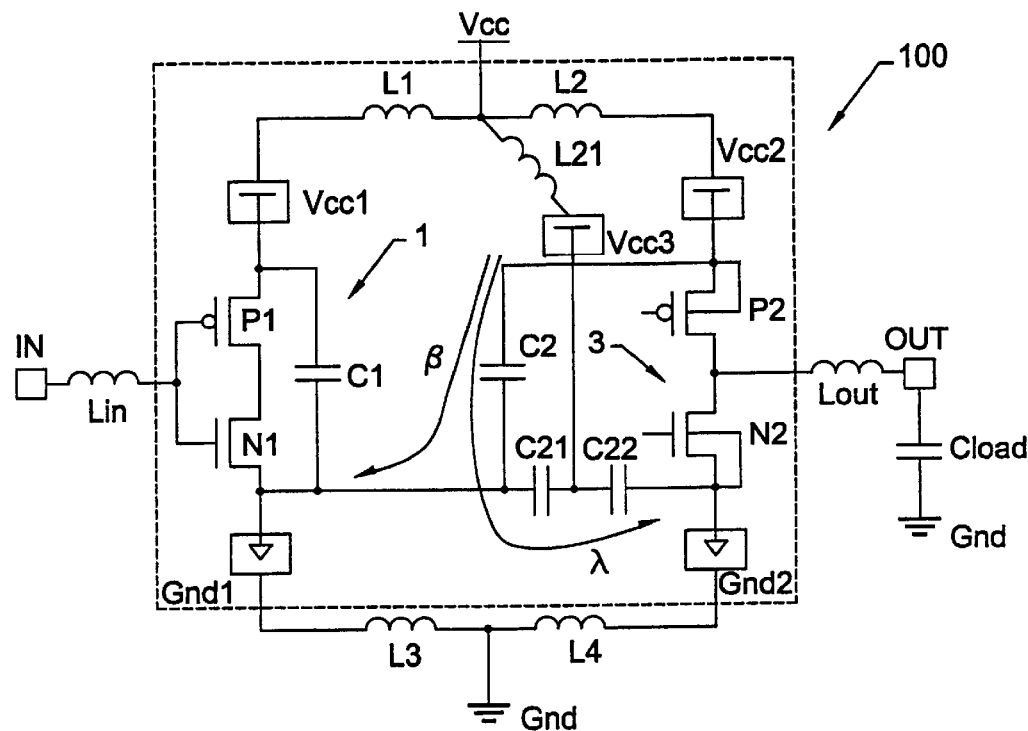
FIG. 6 is an electrical equivalent circuit of an output circuit according to the invention.
Figure 7:
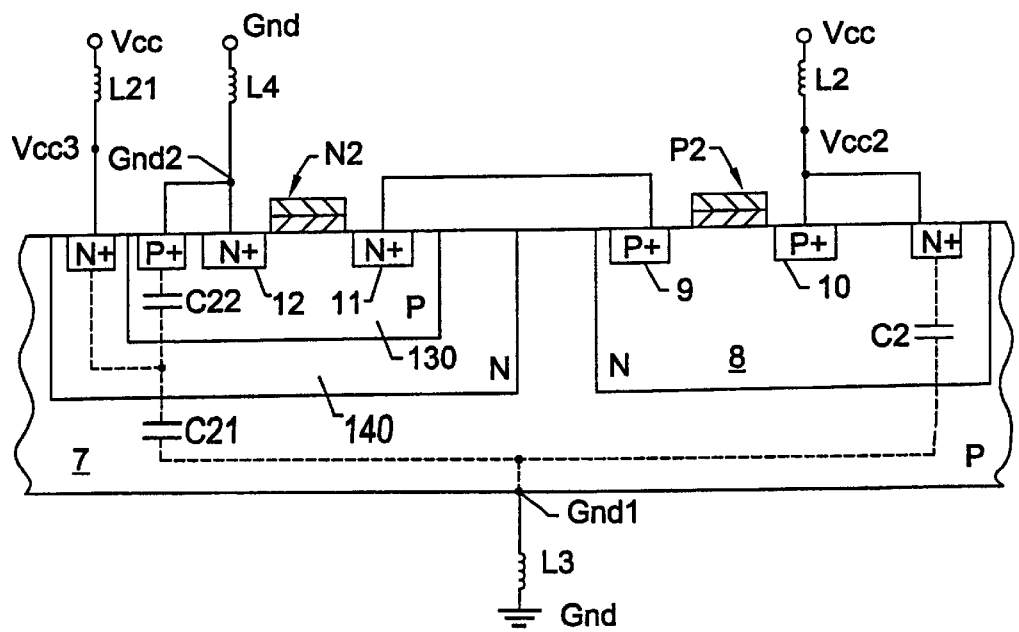
FIG. 7 shows the physical structure of the output circuit according to the invention.

With reference to FIGS. 6 and 7, an output stage according to the present invention comprises an internal supply voltage line Vcc2 and an internal reference voltage line Gnd2 internal to the integrated circuit 100. These lines are respectively connected to an external supply voltage line Vcc and an external reference voltage line Gnd external to the integrated circuit through metal wires L2 and L4, having respective parasitic inductances L2 and L4. Between the supply and reference voltages there are interposed two CMOS transistors driving the output line 5. The P-channel pull-up transistor P2 is placed between the internal supply voltage Vcc2 and the output 5, while the N-channel pull-down transistor N2 is placed between the output 5 and the internal reference voltage Gnd2. Transistor P2 is formed inside an N type well 8 formed in the P type substrate 7, while transistor N2 is formed by means of the so-called triple-well process. The P type well within which transistor N2 is obtained, is in turn formed inside an N type well 140 formed in the P type substrate 7. Such an N type well 140 is connected to a dedicated internal supply voltage Vcc3, connected to the external supply voltage Vcc through a metal wire L21 having a parasitic inductance L21, and which is distinct from the internal supply voltage Vcc2 supplying the output stage.

Figure 1:
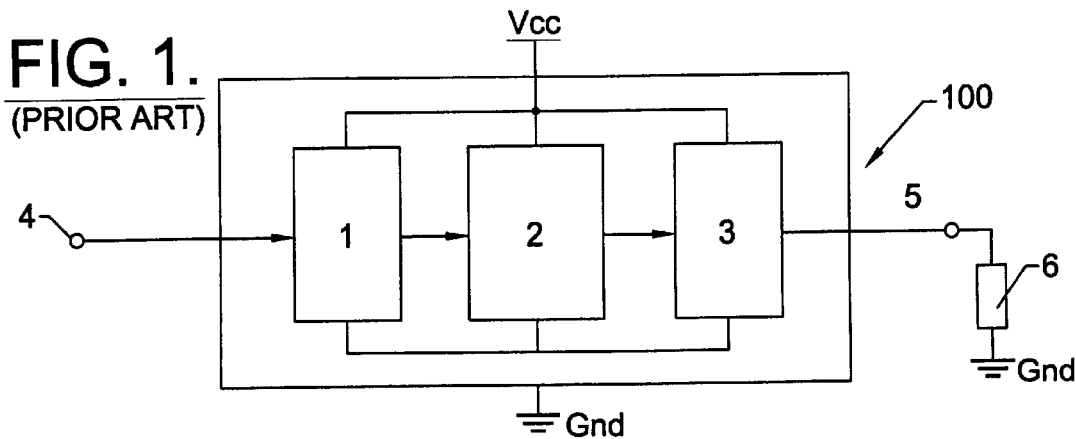
FIG. 1 schematically shows the main functional blocks of a semiconductor integrated circuit according to the prior art.
Figure 2:
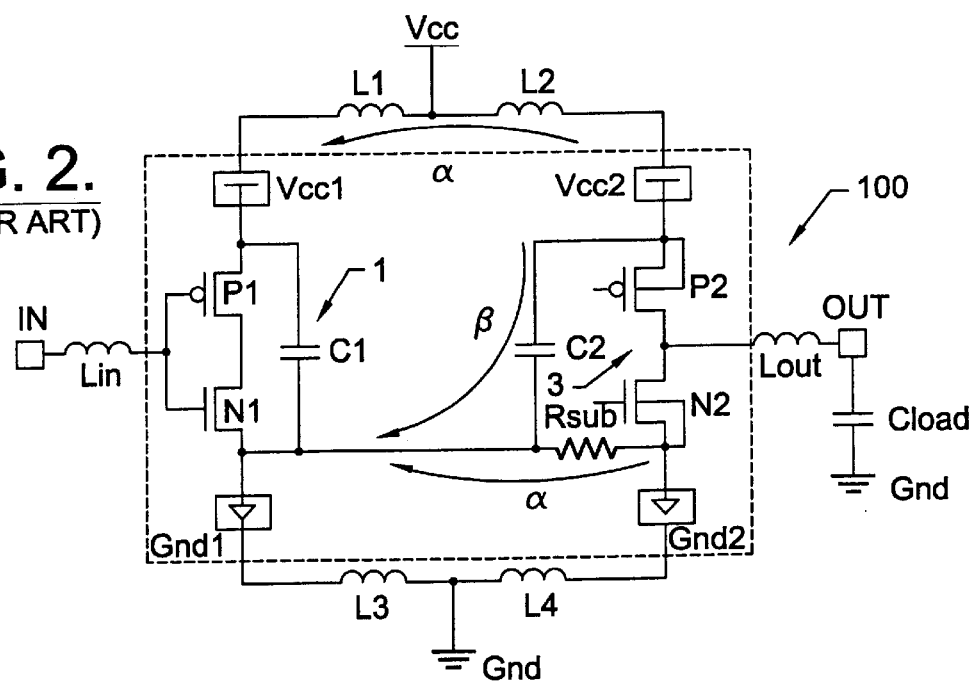
FIG. 2 is an equivalent electrical diagram of an output circuit according to the prior art, with schematically indicated the associated noise propagation paths to an input stage.
Figure 3:
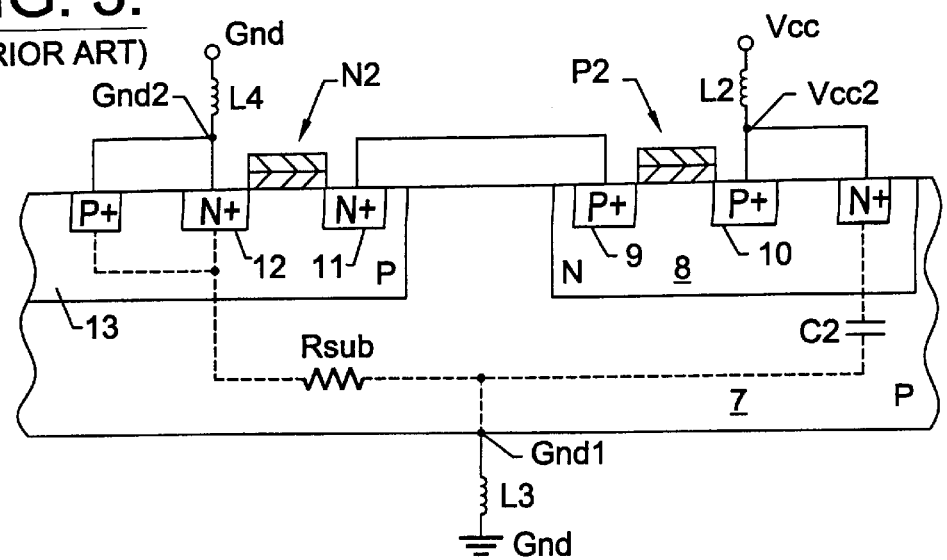
FIG. 3 shows in cross-section the physical structure of the prior art output circuit of FIG. 2.
Figure 4:
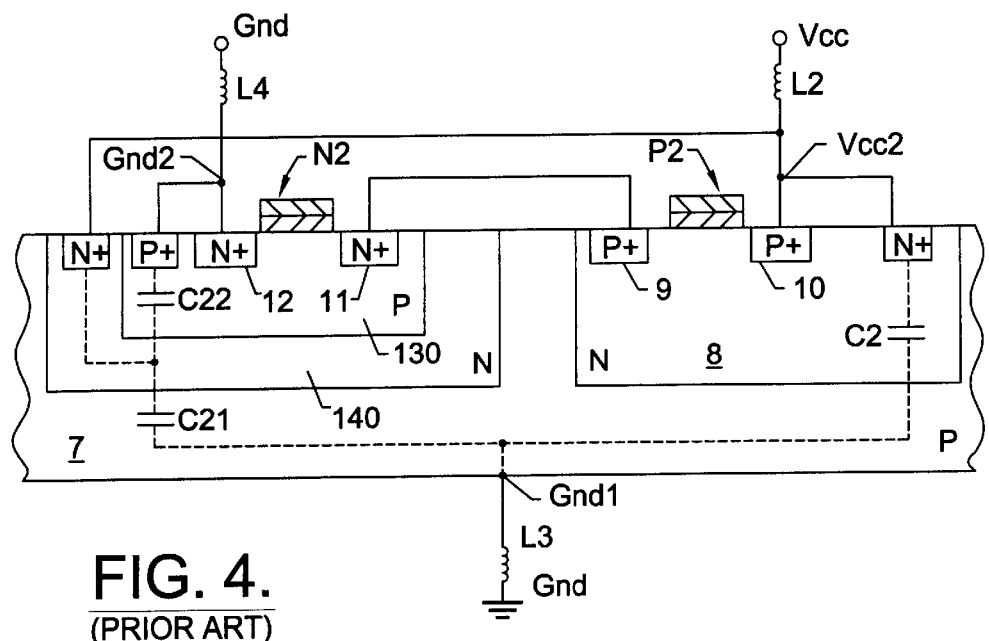
FIG. 4 shows the physical structure of a second type of output circuit according to the prior art, with an N-channel pull-down transistor inside a triple well.
Figure 5:
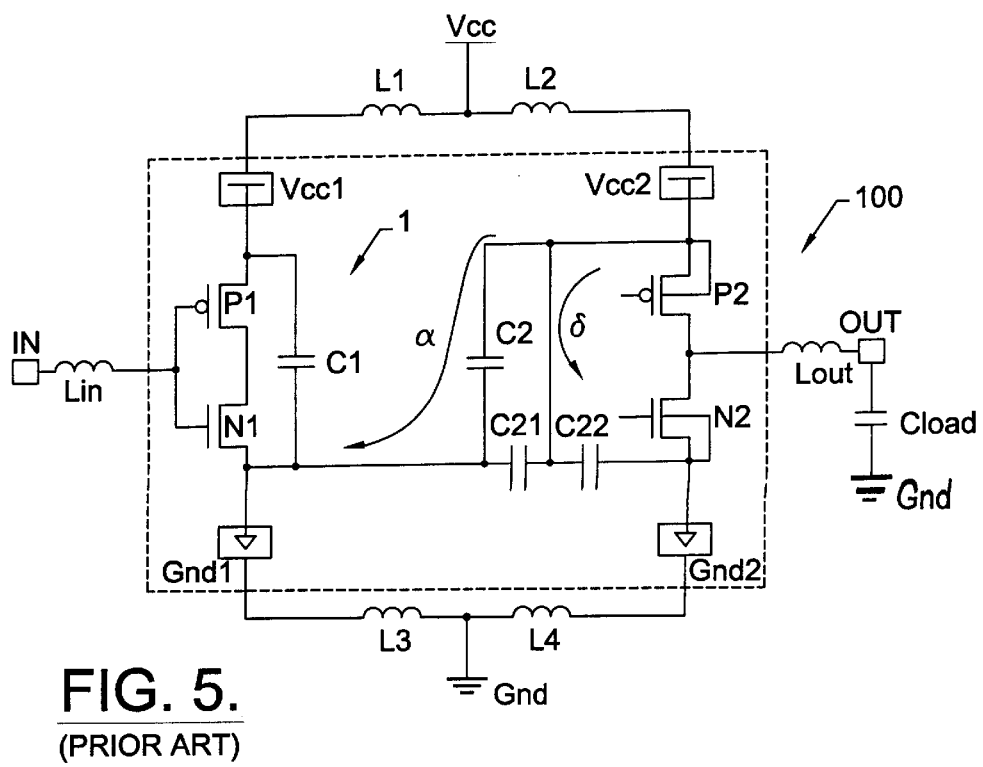
FIG. 5 is similar to FIG. 2, but is referred to the output circuit of FIG. 4.

By means of this arrangement, the coupling between Gnd2 and Gnd1 by the impedance of the series connection of capacitances C21 (associated with the N type well 140/P type substrate 7 junction) and C22 (associated with the P type well 130/N type well 140 junction) provides good noise filtering. This filtering improves the higher the cutoff frequency associated with the filter formed by capacitances C21, C22. Such an approach further permits eliminating the path 6 in FIG. 5, to obtain a significant reduction of the coupling between Vcc2 and Gnd2. Path δ, formed by capacitance C22, is in fact replaced by path γ in FIG. 6 that is the series connection of capacitances C2, C21 and C22, with an increase of the impedance between Vcc2 and Gnd2. The coupling between Vcc2 and Gnd1 is significantly reduced also. Path γ in FIG. 5, formed by the shunt connection of capacitances C2 and C21, is replaced by path β in FIG. 6 formed by the sole capacitance C2, with an increase in the impedance between Vcc2 and Gnd1.

With reference to the above, a dynamic analysis of the circuit according to the invention reveals that, in case of fluctuations of Gnd2 as a consequence of a switching of the pull-down transistors of the output stage, the noise generated on the input circuitry does not vary compared to the known approaches using a triple-well structure. In the case of fluctuations of Vcc2 due to switching of the pull-up transistors of the output stage the noise generated on the input circuitry is much attenuated compared to the known approaches.

That which is claimed is:

1. An output circuit for an integrated circuit, comprising:
    a substrate of a first conductivity type;
    a second well of a second conductivity type in said substrate;
    a first well of the first conductivity type in said second well;
    a first internal voltage supply node;
    a second internal reference voltage supply node;
    a third internal voltage supply node connected to said second well;
    first, second and third electrical connector means for establishing respective first, second and third electrically conductive paths distinct from one another; and
    a first transistor and a second transistor connected in series between said first internal voltage supply node and said second internal reference voltage supply node, said first electrical connector means connecting said first internal voltage supply node to an external voltage supply external to the integrated circuit, said second electrical connector means connecting said second internal reference voltage supply node to an external reference voltage supply external to the integrated circuit, said first transistor connecting an output line of the integrated circuit to the external voltage supply via the first internal voltage supply node, said second transistor being formed in said first well and connecting the output line of the integrated circuit to the external reference voltage supply via the second internal reference voltage supply node;
    said third electrical connector means connecting said third internal voltage supply node to the external voltage supply.

2. An output circuit according to claim 1, wherein said first transistor comprises a first conductivity type channel MOSFET; and wherein said second transistor comprises a second conductivity type channel MOSFET.

3. An output circuit according to claim 2, wherein the first conductivity type is P type and the second conductivity type is N type.

4. An output circuit according to claim 1, wherein said first, second and third electrical connecting means comprise metal wires.

5. An integrated circuit comprising:

a substrate of a first conductivity type;

an input stage formed in said substrate;

internal circuitry formed in said substrate and connected to said input stage; and an output stage formed in said substrate and connected to said internal circuitry for driving an output line, said output stage comprising a second well of a second conductivity type in said substrate, a first well of the first conductivity type in said second well, a first internal voltage supply node, a second internal reference voltage supply node, a third internal voltage supply node connected to said second well, first, second and third electrical conductors for establishing respective first, second and third electrically conductive paths distinct from one another, and a first transistor and a second transistor connected in series between said first internal voltage supply node and said second internal reference voltage supply node, said first electrical conductor connecting said first internal voltage supply node to an external voltage supply external to the integrated circuit, said second electrical conductor connecting said second internal reference voltage supply node to an external reference voltage supply external to the integrated circuit, said first transistor connecting an output line of the integrated circuit to the external voltage supply via the first internal voltage supply node, said second transistor being formed in said first well and connecting the output line of the integrated circuit to the external reference voltage supply via the second internal reference voltage supply node, said third electrical conductor connecting said third internal voltage supply node to the external voltage supply.

6. An integrated circuit according to claim 5, wherein said first transistor comprises a first conductivity type channel MOSFET; and wherein said second transistor comprises a second conductivity type channel MOSFET.

7. An integrated circuit according to claim 6, wherein the first conductivity type is P type and the second conductivity type is N type.

8. An integrated circuit according to claim 5, wherein said first, second and third electrical conductors comprise metal wires.

9. An output circuit for an integrated circuit, comprising:

a substrate of a first conductivity type;

a second well of a second conductivity type in said substrate;

a first well of the first conductivity type in said second well;

a first internal voltage supply node;

a second internal reference voltage supply node;

a third internal voltage supply node connected to said second well;

first, second and third wires; and a first transistor and a second transistor connected in series between said first internal voltage supply node and said second internal reference voltage supply node, said first wire connecting said first internal voltage supply node to an external voltage supply external to the integrated circuit, said second wire connecting said second internal reference voltage supply node to an external reference voltage supply external to the integrated circuit, said first transistor connecting an output line of the integrated circuit to the external voltage supply via the first internal voltage supply node, said second transistor being formed in said first well and connecting the output line of the integrated circuit to the external reference voltage supply via the second internal reference voltage supply node;

said third wire connecting said third internal voltage supply node to the external voltage supply.

10. An output circuit according to claim 9, wherein said first transistor comprises a first conductivity type channel MOSFET; and wherein said second transistor comprises a second conductivity type channel MOSFET.

11. An output circuit according to claim 10, wherein the first conductivity type is P type and the second conductivity type is N type.

12. An output circuit according to claim 9, wherein said first, second and third wires comprise metal.

13. A method for making an output circuit for an integrated circuit comprising the steps of:

forming a second well of a second conductivity type in a substrate of a first conductivity type;

forming a first well of the first conductivity type in said second well;

providing a first internal voltage supply node;

providing a second internal reference voltage supply node;

providing a third internal voltage supply node connected to said second well;

forming a first transistor in said substrate;

forming a second transistor in said first well;

connecting said first transistor and said second transistor in series between said first internal voltage supply node and said second internal reference voltage supply node;

connecting said first wire between said first internal voltage supply node and an external voltage supply external to the integrated circuit;

connecting said second wire between said second internal reference voltage supply node and an external reference voltage supply external to the integrated circuit;

connecting said first transistor to an output line of the integrated circuit;

connecting said second transistor formed in said first well to the output line of the integrated circuit; and connecting said third wire between said third internal voltage supply node and the external voltage supply.

14. A method according to claim 13, wherein the step of forming the first transistor comprises forming a first conductivity type channel MOSFET; and wherein the step of forming the second transistor comprises forming a second conductivity type channel MOSFET.

15. A method according to claim 14, wherein the first conductivity type is P type and the second conductivity type is N type.

* * * * *